US011977780B2

United States Patent
Pathiyakkara Thombra et al.

(10) Patent No.: US 11,977,780 B2
(45) Date of Patent: May 7, 2024

(54) NEAR MEMORY PROCESSING DUAL IN-LINE MEMORY MODULE AND METHOD FOR OPERATING THE SAME

(71) Applicant: SAMSUNG ELECTRONICS CO., LTD., Suwon-si (KR)

(72) Inventors: Eldho Mathew Pathiyakkara Thombra, Bengaluru (IN); Prashant Vishwanath Mahendrakar, Bengaluru (IN); Jin In So, Hwaseong-si (KR); Jong-Geon Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 17 days.

(21) Appl. No.: 17/746,562

(22) Filed: May 17, 2022

(65) Prior Publication Data
US 2022/0365726 A1 Nov. 17, 2022

(30) Foreign Application Priority Data
May 17, 2021 (IN) .............................. 202141022122

(51) Int. Cl.
*G06F 3/06* (2006.01)
(52) U.S. Cl.
CPC .......... *G06F 3/0659* (2013.01); *G06F 3/0604* (2013.01); *G06F 3/0679* (2013.01)
(58) Field of Classification Search
CPC ...... G05B 13/00–048; G05B 15/00–02; G05B 17/00–02; G06F 1/00–3296;
(Continued)

(56) References Cited

U.S. PATENT DOCUMENTS 3,516,069 A * 6/1970 Bray .................... G06F 3/09
710/46
4,394,726 A * 7/1983 Kohl ..................... G06F 13/287
711/149
(Continued)

OTHER PUBLICATIONS

Processing in Memory: Chips to Petaflops; Kogge et al.; In Workshop on Mixing Logic and DRAM: Chips that Compute and Remember at ISCA '97; 1997; retrieved from http://www.cs.ucf.edu/courses/cda5106/summer02/papers/kogge97PIM.pdf on Feb. 25, 2019 (Year: 1997).*

(Continued)

*Primary Examiner* — Daniel C. Chappell
(74) *Attorney, Agent, or Firm* — Sughrue Mion, PLLC

(57) ABSTRACT

A method for operating a Near Memory Processing (NMP) Dual In-line Memory Module (DIMM) for DIMM-to-DIMM communication is provided. The NMP DIMM includes one or more ports for communicative connection to other NMP DIMMs. The method includes parsing, by one NMP DIMM, a NMP command received from a processor of a host platform, identifying data dependencies on one or more other NMP DIMMs based on the parsing, establishing communication with the one or more other NMP DIMMs through one or more ports of the one NMP DIMM, receiving data from the one or more other NMP DIMMs through one or more ports of the one NMP DIMM, processing the NMP command using the data received from one of the one or more other NMP DIMMs and data present in the one NMP DIMM, and sending a NMP command completion notification to the processor of the host platform.

15 Claims, 7 Drawing Sheets

(58) Field of Classification Search
CPC ............... G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 18/00–41; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G06N 3/00–126; G06N 5/00–048; G06N 7/00–08; G06N 10/00; G06N 20/00–20; G06N 99/00–007; G06T 1/00–60; G06V 30/00–43; G11B 20/00–24; G11B 33/00–1493; G11C 11/00–5692; G11C 13/00–06; G11C 14/00–009; G11C 15/00–06; G11C 16/00–3495; G11C 17/00–18; G11C 2207/00–229; G11C 2216/00–30; H01L 25/00–50; H01L 2225/00–1094; H03M 7/00–707; H04L 9/00–38; H04L 12/00–66; H04L 41/00–5096; H04L 49/00–9094; H04L 61/00–59; H04L 67/00–75

See application file for complete search history.

(56) References Cited

U.S. PATENT DOCUMENTS

| | | | | |
|---|---|---|---|---|
| 4,600,986 | A * | 7/1986 | Scheuneman | G06F 9/3824 |
| | | | | 712/E9.046 |
| 10,915,544 | B2 * | 2/2021 | Greene | G06F 16/254 |
| 10,936,891 | B2 * | 3/2021 | Kim | G06T 1/20 |
| 2005/0278502 | A1 * | 12/2005 | Hundley | G06F 9/4843 |
| | | | | 712/34 |
| 2005/0289287 | A1 * | 12/2005 | Shin | G06F 11/267 |
| | | | | 714/E11.207 |
| 2007/0030814 | A1 * | 2/2007 | Shin | G11C 29/08 |
| | | | | 365/201 |
| 2009/0307416 | A1 * | 12/2009 | Luo | G06F 12/0246 |
| | | | | 711/E12.083 |
| 2017/0005438 | A1 * | 1/2017 | Benedict | H01R 12/737 |
| 2019/0205244 | A1 * | 7/2019 | Smith | G06F 3/065 |
| 2020/0159584 | A1 * | 5/2020 | Cho | G06F 9/5016 |
| 2021/0034294 | A1 * | 2/2021 | Sudarmani | G06F 3/0653 |
| 2021/0064234 | A1 * | 3/2021 | Zhang | G06F 9/5016 |
| 2021/0390049 | A1 * | 12/2021 | Kim | G06F 12/0284 |
| 2023/0004489 | A1 * | 1/2023 | Talanki | G06F 12/0284 |
| 2023/0026505 | A1 * | 1/2023 | Lee | G06F 3/0679 |
| 2023/0124520 | A1 * | 4/2023 | Zhong | G06F 3/067 |
| | | | | 712/220 |
| 2023/0127869 | A1 * | 4/2023 | Tai | G06F 9/5038 |
| | | | | 718/103 |
| 2023/0400985 | A1 * | 12/2023 | Kim | G06F 3/0613 |
| 2023/0418474 | A1 * | 12/2023 | Kim | G06F 3/0659 |

OTHER PUBLICATIONS

W. J. Lee, C. H. Kim, Y. Paik and S. W. Kim, "PISA-DMA: Processing-in-Memory Instruction Set Architecture Using DMA," in IEEE Access, vol. 11, pp. 8622-8632, 2023, doi: 10.1109/ACCESS.2023.3238812. (Year: 2023).*

C. H. Kim et al., "Silent-PIM: Realizing the Processing-in-Memory Computing With Standard Memory Requests," in IEEE Transactions on Parallel and Distributed Systems, vol. 33, No. 2, pp. 251-262, Feb. 1, 2022, doi: 10.1109/TPDS.2021.3065365. (Year: 2022).*

* cited by examiner

NEAR MEMORY PROCESSING DUAL IN-LINE MEMORY MODULE AND METHOD FOR OPERATING THE SAME

CROSS-REFERENCE TO RELATED APPLICATIONS

This U.S. non-provisional application claims priority under 35 U.S.C § 119 from Indian Patent Application No. 202141022122 filed on May 17, 2021, in the Indian Intellectual Property Office, the entire contents of which are hereby incorporated by reference in their entirety.

BACKGROUND

Methods, apparatuses, and devices consistent with the present disclosure relate to Near Memory Processing (NMP) Dual In-line Memory Modules (DIMMs) and methods for operating NMP DIMMs for DIMM-to-DIMM communication.

Dual In-line Memory Modules (DIMMs) are memory modules that include multiple Dynamic Random-Access Memories (DRAMs). Generally, data is moved between two DIMMs through a central processing unit (CPU) and respective memory controllers of a host. This data movement uses considerable CPU load, and consequently, adds latency to the data movement and adds CPU processing cycles. Similarly, when a local DIMM connected to a host communicates with a remote DIMM connected to a remote host, a similar latency occurs in the data movement since the data moves through the CPUs, memory controllers, and network interface controllers (NICs) of both local and remote hosts.

SUMMARY

According to an aspect of an embodiment, there is provided a method for operating a Near Memory Processing (NMP) Dual In-line Memory Module (DIMM) for DIMM-to-DIMM communication. The method comprises parsing, by one NMP DIMM among a plurality of NMP DIMMs, a NMP command received from a processor of a host platform, wherein each of the plurality of NMP DIMMs comprises one or more ports; identifying, by the one NMP DIMM, data dependencies on one or more other NMP DIMMs among the plurality of NMP DIMMs, based on the parsed NMP command; establishing, by the one NMP DIMM, communication with the one or more other NMP DIMMs through the one or more ports of the one NMP DIMM; receiving, by the one NMP DIMM, data from the one or more other NMP DIMMs through the one or more ports of the one NMP DIMM; processing, by the one NMP DIMM, the NMP command using at least one of the data received from the one or more other NMP DIMMs and data present in the one NMP DIMM; and sending, by the one NMP DIMM, a NMP command completion notification to the processor of the host platform.

According to another aspect of an embodiment, there is provided a Near Memory Processing (NMP) Dual In-line Memory Module (DIMM) for DIMM-to-DIMM communication. The NMP DIMM comprises one or more ports, each of the one or more ports configured to establish communication with a port of another NMP DIMM among a plurality of NMP DIMMs; and a processing node communicatively interfaced with each of the one or more ports, the processing node configured to parse a NMP command received from a processor of a host platform, identify data dependencies on one or more other NMP DIMMs among the plurality of NMP DIMMs, based on the parsed NMP command, receive data from the one or more other NMP DIMMs through the one or more ports, process the NMP command using at least one of the data received from the one or more other NMP DIMMs and data present in the NMP DIMM, and send a NMP command completion notification to the processor of the host platform.

According to yet another aspect of an embodiment, there is provided a method for operating Near Memory Processing (NMP) Dual In-line Memory Module (DIMM) for DIMM-to-DIMM communication. The method comprises identifying, by a processor of a host platform, data dependencies to offload a NMP command to one NMP DIMM among a plurality of NMP DIMMs, wherein each of the plurality of NMP DIMMs comprises one or more ports; initiating, by the processor of the host platform, aggregation of data to the one NMP DIMM by queuing data read requests to the one NMP DIMM; establishing, by the one NMP DIMM, communication with one or more other NMP DIMMs among the plurality of NMP DIMMS through the one or more ports of the one NMP DIMM; receiving, by the one NMP DIMM, data from the one or more other NMP DIMMs through the one or more ports of the one NMP DIMM; receiving, by the one NMP DIMM, the NMP command from the processor of the host platform; processing, by the one NMP DIMM, the NMP command using at least one of the data received from the one or more other NMP DIMMs and data present in the one NMP DIMM; and sending, by the one NMP DIMM, a NMP command completion notification to the processor of the host platform.

According to yet another aspect of an embodiment, there is provided a system for Dual In-line Memory Module (DIMM)-to-DIMM communication. The system comprises a plurality of Near Memory Processing (NMP) Dual In-line Memory Modules (DIMMs), each NMP DIMM comprising a processing node and one or more ports, each of the one or more ports configured to establish communication with a port among the one or more ports of another NMP DIMM of the plurality of NMP DIMMs; and a processor of a host platform. The processor of the host platform is configured to identify data dependencies to offload a Near Memory Processing (NMP) command to one NMP DIMM among the plurality of NMP DIMMs; and initiate aggregation of data to the one NMP DIMM by queuing data read requests to the one NMP DIMM. The processing node of the one NMP DIMM is configured to receive data from one or more other NMP DIMMs among the plurality of NMP DIMMS through the one or more ports of the one NMP DIMM, receive the NMP command from the processor of the host platform, process the NMP command using the data received from at least one of the one or more other NMP DIMMs and data present in the one NMP DIMM, and send a NMP command completion notification to the processor of the host platform.

DETAILED DESCRIPTION

Figure 1:
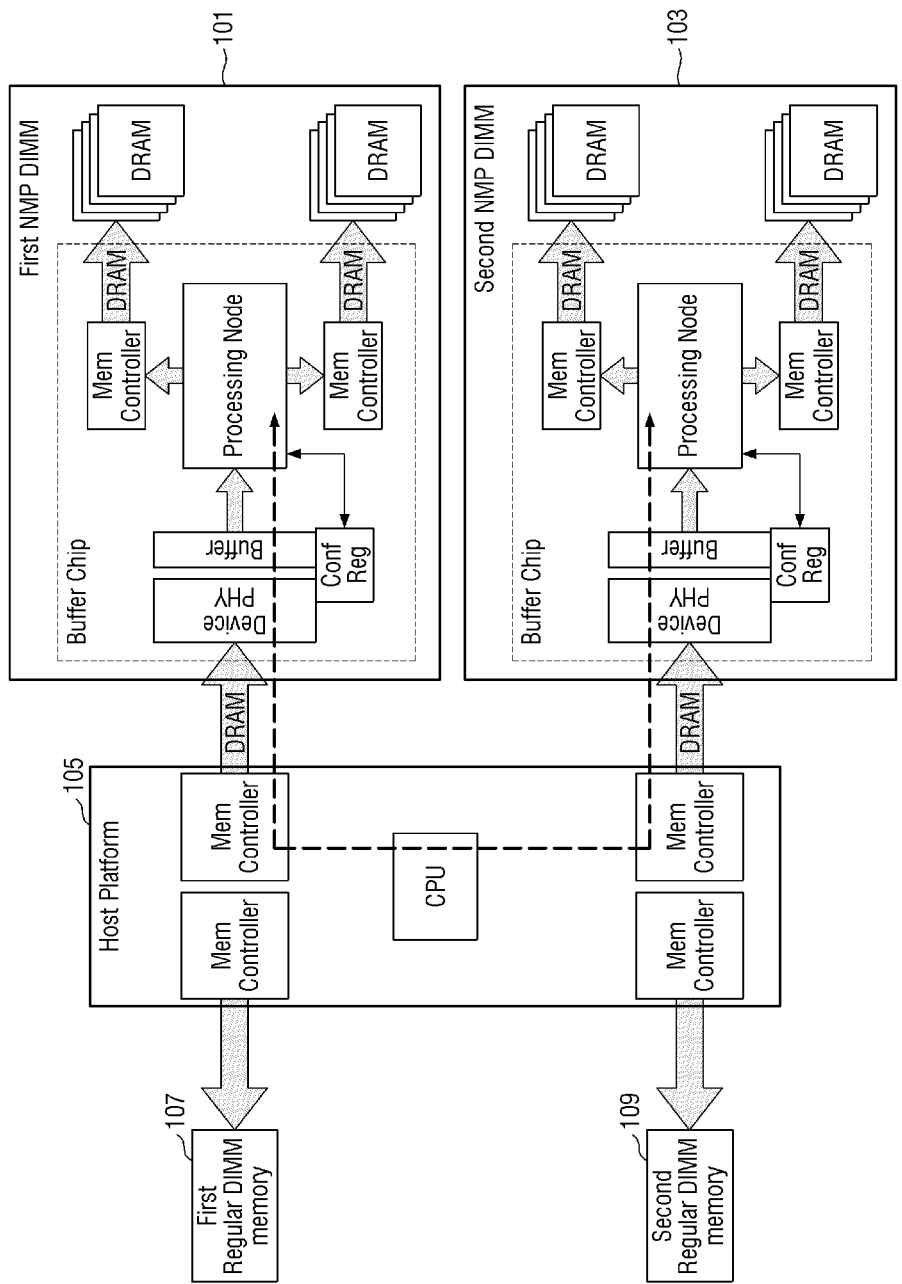
FIG. 1 illustrates a related art computing environment for DIMM-to-DIMM communication.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however, that a specific embodiment described herein is not intended to limit the disclosure to the particular forms disclosed, but on the contrary, the disclosure is to cover all modifications, equivalents, and alternatives falling within the scope of the disclosure.

The terms "comprises", "comprising", or any other variations thereof, are intended to cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or method.

In the following detailed description of the embodiments, reference is made to the accompanying drawings that form a part hereof, and in which are shown by way of illustration specific embodiments in which the disclosure may be practiced. These embodiments are described in sufficient detail to enable those skilled in the art to practice the disclosure, and it is to be understood that other embodiments may be utilized and that changes may be made without departing from the scope of the present disclosure. The following description is, therefore, not to be taken in a limiting sense.

FIG. 1 illustrates a related art computing environment for Dual In-line Memory Module (DIMM) to DIMM communication. As shown in FIG. 1, the computing environment includes a first Near Memory Processing (NMP) DIMM 101, a second NMP DIMM 103, a host platform 105, a first regular DIMM memory 107, and a second regular DIMM memory 109. When data is moved between the first NMP DIMM 101 and the second NMP DIMM 103, the data moves through a central processing unit (CPU) of the host platform 105 and memory controllers of the host platform 105 that are associated respectively with each of the first NMP DIMM 101 and the second NMP DIMM 103, as shown by the dashed arrows illustrated in FIG. 1. This data movement thus causes considerable CPU load, and consequently, adds latency to the data movement and adds CPU processing cycles.

Figure 2A:
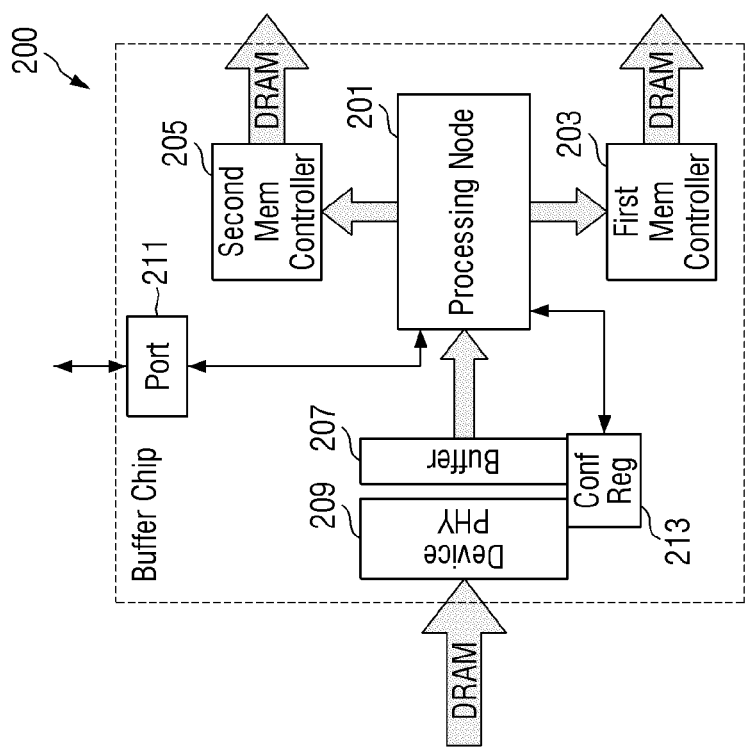
FIG. 2A shows a block diagram of a NMP DIMM, in accordance with some embodiments.
Figure 2B:
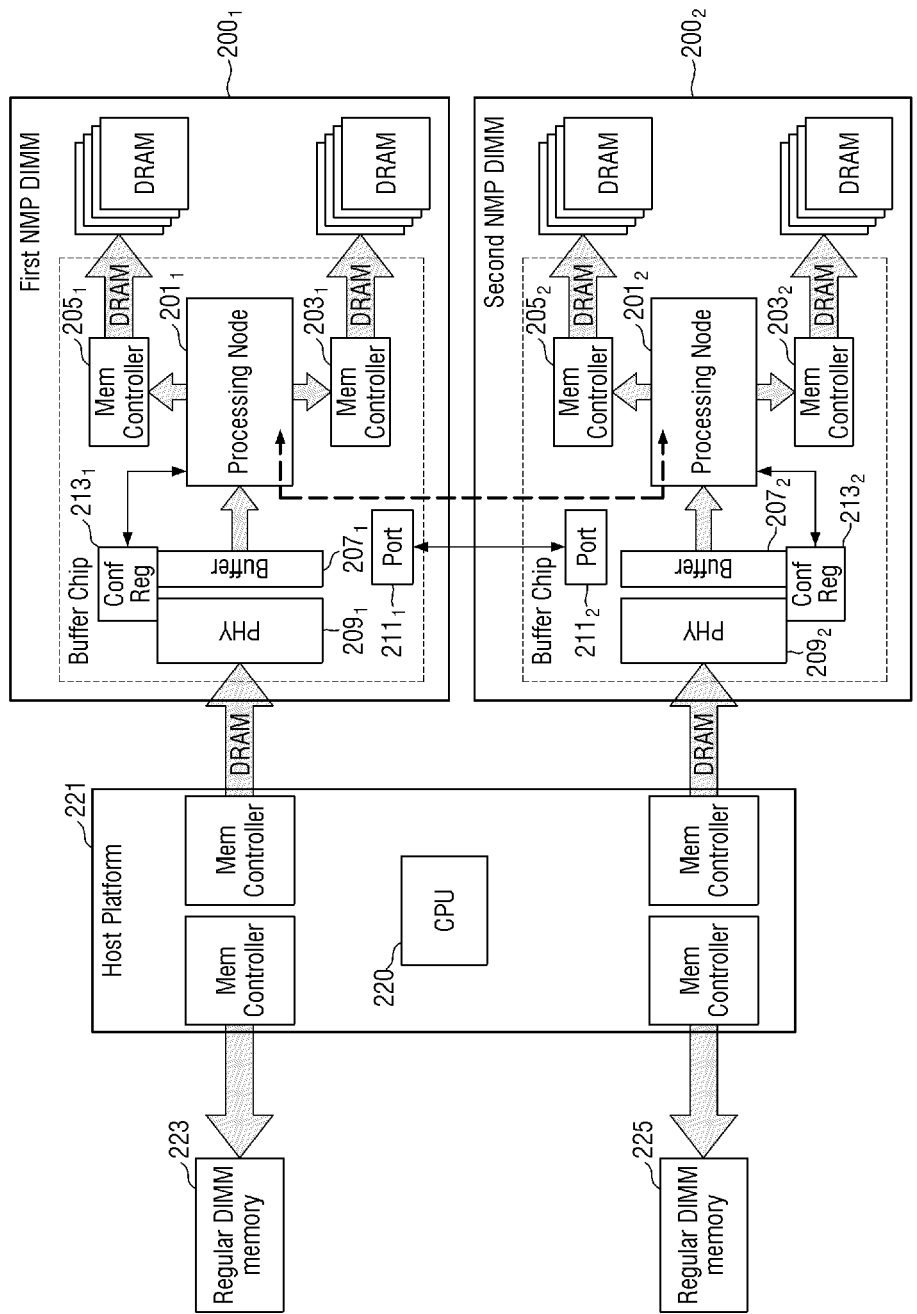
FIG. 2B illustrates a system implementing the NMP DIMM of FIG. 2A, accordance with some embodiments.

FIG. 2A shows a block diagram of a Near Memory Processing (NMP) Dual In-Line Memory Module (DIMM), in accordance with some embodiments. FIG. 2B illustrates a system implementing the NMP DIMM of FIG. 2A, accordance with some embodiments A NMP DIMM 200 of FIGS. 2A and 2B includes one port for DIMM to DIMM communication.

As shown in the FIG. 2A, the NMP DIMM 200 comprises a processing node 201, a first memory controller 203, a second memory controller 205, a buffer 207, a physical layer (PHY) 209, a port 211, a Configuration Register (Conf Reg) 213, and Dynamic Random-Access Memory (DRAM) connections to a plurality of DRAMs (not shown in FIG. 2A; see FIG. 2B) connected to each of the first and second memory controllers 203 and 205. In some embodiments, the port 211 may be an xPort. In some embodiments, the processing node 201 may be a microprocessor that fetches NMP commands from the buffer 207, parses the NMP commands and executes the NMP commands. In other embodiments, the processing node 201 may be a central processing unit (CPU), and may operate in conjunction with a CPU (i.e., a processor) of a host platform by passing instructions and data through a status register present in the Conf Reg 213. The PHY 209 may provide device level interface to a physical channel of a standard DIMM interface. The device level interface is compliant with a protocol standard and takes care of parameters for proper operations of the standard DIMM interface. Each of the first and second memory controllers 203 and 205 may provide an interface between the processing node 201 and the plurality of DRAMs on the NMP DIMM 200 (see FIG. 2B). In some embodiments, there may be direct path from the PHY 209 to the first and second memory controllers 203 and 205 to enable a direct access path from the CPU of the host platform. The buffer 207 may be a space that the host platform may use for exchanging commands, controls, and/or data information between a processing system and the plurality of DRAMs. At least a portion of the buffer 207 may be allocated for the Conf Reg 213 for controlling/configuring processing node 201 and also, to collect status information. An example of the Conf Reg 213 is shown in Table 1 for an embodiment in which 4 NMP DIMMs are connected. A routing protocol, for example, may be (i) if the data needs to be accessed from an address which is lower than a present DIMM ID address range, then the data may be placed to an UP direction port, and (ii) if the data needs to be accessed from an address which is higher than a present DIMM ID address range, then the data may be placed to a DOWN direction port.

TABLE 1

| Offset | Register description | Details |
|---|---|---|
| 0x0000~0x0007 | 64 bit base address of $1^{st}$ DIMM | Defines physical address range of $1^{st}$ DIMM (DIMM ID = 1) |
| 0x0008~0x000F | 64 bit limit address of $1^{st}$ DIMM | Will be configured same on all DIMMs |
| 0x0010~0x0017 | 64 bit base address of $2^{nd}$ DIMM | Defines physical address range of $2^{nd}$ DIMM (DIMM ID = 2) |
| 0x0018~0x001F | 64 bit limit address of $2^{nd}$ DIMM | Will be configured same on all DIMMs |
| 0x0020~0x0027 | 64 bit base address of $3^{rd}$ DIMM | Defines physical address range of $3^{rd}$ DIMM (DIMM ID = 3) |
| 0x0028~0x002F | 64 bit limit address of $3^{rd}$ DIMM | Will be configured same on all DIMMs |
| 0x0030~0x0037 | 64 bit base address of $4^{th}$ DIMM | Defines physical address range of $4^{th}$ DIMM (DIMM ID = 4) |
| 0x0038~0x003F | 64 bit limit address of $4^{th}$ DIMM | Will be configured same on all DIMMs |

TABLE 1-continued

| Offset | Register description | Details |
| --- | --- | --- |
| 0x0040 | Present DIMM ID (1/2/3/4) | Defines ID of present DIMM |
| 0x0044 | xPort direction setting register: [0]: 0- xPort 1 is UP; 1- xPort 1 DOWN [1]: 0- xPort2 is UP; 1- xPort2 DOWN Remaining bits can be reserved. | One port should be configured as UP other port should be configured as DOWN in all DIMMs; depends on the actual connections. If both bits are configured 0, then port 1 will be disabled. If both bits are configured 1, then port 0 will be disabled. This feature may be used at terminating end DIMM ports if further connection does not exist. |

In some embodiments, the port 211 may be a physical port introduced in the NMP DIMM 200. The port 211 may be communicatively connected to the processing node 201 as shown in FIG. 2A. The processing node 201 may control the operation of the port 211. The port 211 may be communicatively connected to another port of an another NMP DIMM, as shown in the system of FIG. 2B.

With reference to FIG. 2B, the system may include a first NMP DIMM 200₁ and a second NMP DIMM 200₂. A port 211₁ of the first NMP DIMM 200₁ may be communicatively connected to a port 211₂ of the second NMP DIMM 200₂. The connection between the port 211₁ of the first NMP DIMM 200₁ and the port 211₂ of the second NMP DIMM 200₂ may be a wired connection or a wireless connection. A person skilled in the art would understand that, any wireless communication protocol, not mentioned explicitly, may be used as wireless connection in the present disclosure.

Hereafter, the operation of the NMP DIMM 200 comprising one port for DIMM-to-DIMM communication is explained with reference to the FIG. 2B. A CPU 220 (also, referred as a processor) of a host platform 221 may send a NMP command to the first NMP DIMM 200₁ among the first NMP DIMM 200₁ and the second NMP DIMM 200₂. On receiving the NMP command, the first NMP DIMM 200₁ may parse the NMP command. Subsequently, the first NMP DIMM 200₁ may identify data dependencies on one or more other NMP DIMMs, in this case the second NMP DIMM 200₂, based on the parsed NMP command. In some embodiments, the first NMP DIMM 200₁ may identify data dependencies on the first NMP DIMM 200₁ and the one or more other NMP DIMMs, in this case the second NMP DIMM 200₂, based on the parsed NMP command. The first NMP DIMM 200₁ may establish a communication with the second NMP DIMM 200₂ through corresponding ports, i.e., through the port 211₁ of the first NMP DIMM 200₁ and the port 211₂ of the second NMP DIMM 200₂. The first NMP DIMM 200₁ may receive the data from the second NMP DIMM 200₂ through the corresponding ports. On receiving the data from the second NMP DIMM 200₂, the first NMP DIMM 200₁ may process the NMP command using the received data and may send a NMP command completion notification to the CPU 220 of the host platform 221.

In other embodiments, the second NMP DIMM 200₂ among the first NMP DIMM 200₁ and the second NMP DIMM 200₂ may receive the NMP command from the CPU 220 of the host platform 221. In this situation, the above-mentioned operation of the NMP DIMM for DIMM-to-DIMM communication may be performed by the second NMP DIMM 200₂ instead of the first NMP DIMM 200₁.

In yet other embodiments, each of the port 211₁ of first NMP DIMM 200₁ and the port 211₂ of the second NMP DIMM 200₂ may be communicatively connected to at least one remote server through an external switch for accessing data.

In yet other embodiments, the operation of a system comprising a NMP DIMM 200 comprising one port and the CPU 220 (also, referred as a processor) of the host platform 221 for DIMM-to-DIMM communication is explained with reference to the FIG. 2B. The CPU 220 of the host platform 221 may identify data dependencies to offload a NMP command to the first NMP DIMM 200₁ among the first NMP DIMM 200₁ and the second NMP DIMM 200₂. Subsequently, the CPU 220 of the host platform 221 may initiate aggregation of data to the first NMP DIMM 200₁ among the first NMP DIMM 200₁ and the second NMP DIMM 200₂ by queuing data read requests to the first NMP DIMM 200₁. The first NMP DIMM 200₁ may establish communication with the second NMP DIMM 200₂ through corresponding ports, i.e., through the port 211₁ of the first NMP DIMM 200₁ and the port 211₂ of the second NMP DIMM 200₂. The first NMP DIMM 200₁ may receive the data from the second NMP DIMM 200₂ through the corresponding ports. Thereafter, the first NMP DIMM 200₁ may receive a NMP command from the CPU 220 of the host platform 221. On receiving the NMP command, the first NMP DIMM 200₁ may process the NMP command using the received data from the second NMP DIMM 200₂ and may send a NMP command completion notification to the CPU 220 of the host platform 221.

Figure 3A:
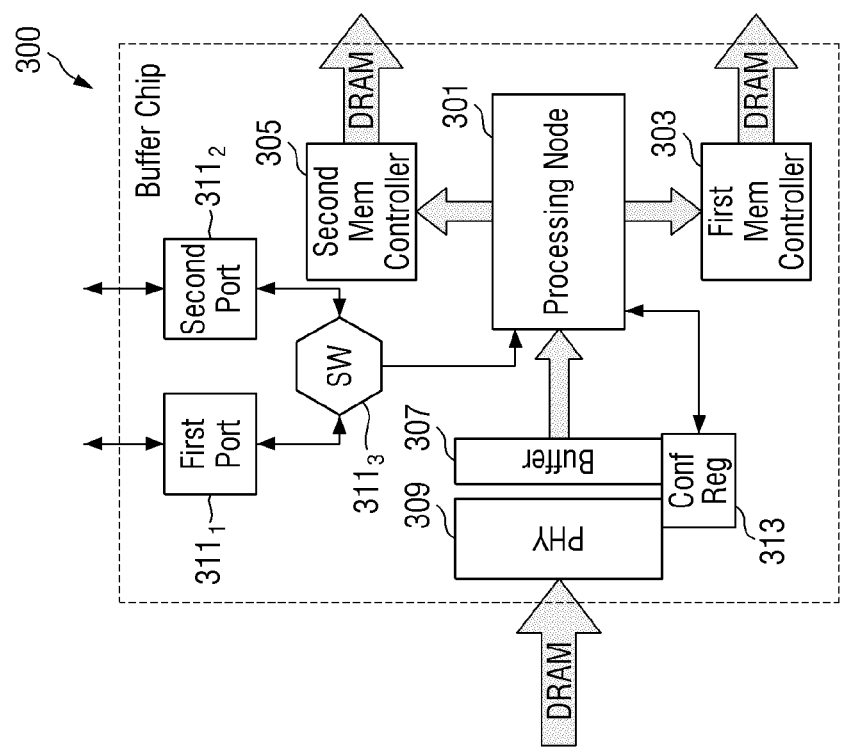
FIG. 3A shows a block diagram of a NMP DIMM, in accordance with some embodiments.
Figure 3B:
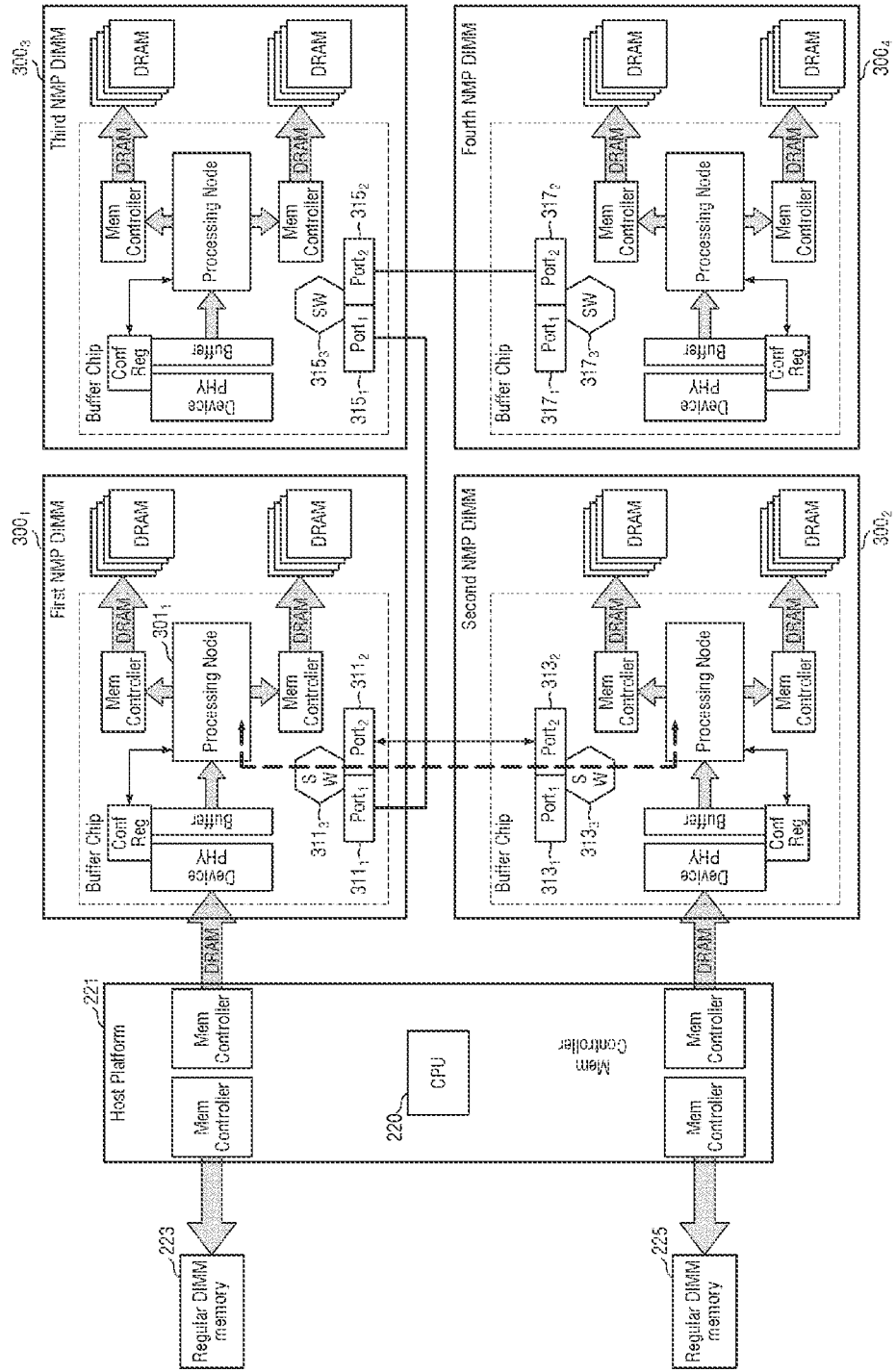
FIG. 3B illustrates a system implementing the NMP DIMM of FIG. 3A, in accordance with some embodiments.

FIG. 3A shows a block diagram of a NMP DIMM, in accordance with some embodiments. FIG. 3B illustrates a system implementing the NMP DIMM of FIG. 3A, in accordance with some embodiments. A NMP DIMM 300 of FIGS. 3A and 3B includes two ports for DIMM to DIMM communication.

As shown in FIG. 3A, the NMP DIMM 300 may be one NMP DIMM among a plurality of NMP DIMMs. In this case, each of the plurality of NMP DIMMs has a similar structure and configuration. The NMP DIMM 300 may comprise a processing node 301, a first memory controller 303 and a second memory controller 305, a buffer 307, a device physical layer (PHY) 309, a first port 311₁ and a second port 311₂, a switch (SW) 311₃, a Configuration Register (Conf Reg) 313, and Dynamic Random-Access Memory (DRAM) connections to a plurality of DRAMs (not shown in FIG. 3A; see FIG. 3B) connected to each of the first and second memory controllers 303 and 305. Each of the first and second ports 311₁ and 311₂ may be an xPort. In some embodiments, the processing node 301 may be a microprocessor that fetches NMP commands from the buffer 307, parses the NMP commands and executes the NMP commands. In other embodiments, the processing node 301 may be a central processing unit (CPU), and may operate in conjunction with a CPU (i.e., a processor) of a host platform by passing instructions and data through a status register present in the Conf Reg 313. The PHY 309 may provide a device level interface to a physical channel of a standard DIMM interface. The device level interface is compliant with a protocol standard and takes care of parameters for proper operations of the standard DIMM interface. Each of the first and second memory controllers 303 and 305 may provide an interface between the processing node 301 and the plurality of DRAMs on the NMP DIMM 300 (see FIG. 3B). In some embodiments, there may be a direct path from the PHY 309 to the first and second memory controllers 303 and 305 to enable a direct access path from the CPU of the host platform. The buffer 307 may be a space that the host platform may use for exchanging commands, controls, and/or data information between a processing system and the plurality of DRAMs. At least a portion of the buffer 307 may be allocated for the Conf Reg 313 for controlling/configuring processing node 301 and also, to collect status information. An example of the Conf Reg 313 is shown in Table 1 for an embodiment in which 4 NMP DIMMs are connected. A routing protocol, for example, may be (i) if the data needs to be accessed from an address which is lower than a present DIMM ID address range, then the data may be placed to an UP direction port, and (ii) if the data needs to be accessed from an address which is higher than a present DIMM ID address range, then the data may be placed to a DOWN direction port.

In some embodiments, each of the first port $311_1$ and the second port $311_2$ may be an independent physical ports introduced in the NMP DIMM 300. The first port $311_1$ and the second port $311_2$ may be communicatively connected to the SW $311_3$, which in turn may be communicatively connected to the processing node 301 as shown in FIG. 3A. The processing node 301 may control the operation of the SW $311_3$, which in turn may be may control the operation of the first port $311_1$ and the second port $311_2$. The SW $311_3$ may pass traffic from the first port $311_1$ to the second port $311_2$, if the traffic is not meant for the particular NMP DIMM. The information in the Conf Reg 313 may be shared with the SW $311_3$. Each of the first port $311_1$ and the second port $311_2$ may be communicatively connected to two separate ports of other NMP DIMMs 300 to form a network of the plurality of NMP DIMMs 300, as shown in the system of FIG. 3B.

With reference to FIG. 3B, the system may include a first NMP DIMM $300_1$, a second NMP DIMM $300_2$, a third NMP DIMM $300_3$, and a fourth NMP DIMM $300_4$. A first port $311_1$ of the first NMP DIMM $300_1$ may be communicatively connected to a first port $315_1$ of the third NMP DIMM $300_3$ and a second port $311_2$ of the first NMP DIMM $300_1$ may be communicatively connected a second port $313_2$ of the second NMP DIMM $300_2$. The connection between the first port $311_1$ of the first NMP DIMM $300_1$ and the first port $315_1$ of the third NMP DIMM $300_3$ may be a wired connection or a wireless connection. Analogously, the connection between the second port $311_2$ of the first NMP DIMM $300_1$ and the second port $313_2$ of the second NMP DIMM $300_2$ may be a wired connection or a wireless connection. A person skilled in the art would understand that, any wireless communication protocol, not mentioned explicitly, may be used as wireless connection in the present disclosure.

Hereafter, the operation of the system including NMP DIMMs 300 comprising two ports for DIMM-to-DIMM communication is explained with reference to the system of FIG. 3B. A CPU 220 (also, referred as a processor) of a host platform 221 may send a NMP command to the first NMP DIMM $300_1$ among the first NMP DIMM $300_1$ and the third NMP DIMM $300_3$. On receiving the NMP command, the first NMP DIMM $300_1$ may parse the NMP command. Subsequently, the first NMP DIMM $300_1$ may identify data dependencies on one or more other NMP DIMMs, in this case the third NMP DIMM $300_3$, based on the parsed NMP command. In some embodiments, the first NMP DIMM $300_1$ may identify data dependencies on the first NMP DIMM $300_1$ and the one or more other NMP DIMMs, in this case the third NMP DIMM $300_3$ based on the parsed NMP command. The first NMP DIMM $300_1$ may establish a communication with the third NMP DIMM $300_3$ through corresponding ports, i.e., through the first port $311_1$ of the first NMP DIMM $300_1$ and the first port 3151 of the third NMP DIMM $300_3$. The selection of the first port $311_1$ of the first NMP DIMM $300_1$ for communication with the first port $315_1$ of the third NMP DIMM $300_3$ may be performed through the SW $311_3$, which in turn may be based on identification of data dependencies on one or more other NMP DIMMs, in this case the third NMP DIMM $300_3$. The working of the SW $311_3$ may be controlled by the processing node 3011 of the first NMP DIMM $300_1$. The first NMP DIMM $300_1$ may receive the data from the third NMP DIMM $300_3$ through the corresponding ports. On receiving the data, the first NMP DIMM $300_1$ may process the NMP command using the received data from the third NMP DIMM $300_3$ and may send a NMP command completion notification to the CPU 220 of the host platform 221.

In other embodiments, the third NMP DIMM $300_3$ among the first NMP DIMM $300_1$ and the third NMP DIMM $300_3$ may receive the NMP command from the CPU 220 of the host platform 221. In this situation, the above-mentioned operation of the NMP DIMM for DIMM-to-DIMM communication may be performed by the third NMP DIMM $300_3$ instead of the first NMP DIMM $300_1$ in a similar manner as described above with respect to the first NMP DIMM $300_1$. Accordingly, repeated description thereof is omitted for conciseness.

In yet other embodiments, each one of the two ports of the first NMP DIMM $300_1$, the second NMP DIMM $300_2$, the third NMP DIMM $300_3$ and the fourth NMP DIMM $300_4$ may be communicatively connected to at least one remote server through an external switch for accessing data.

In yet other embodiments, the operation of the system comprising a NMP DIMM 300 comprising two port and a CPU 220 (also, referred as a processor) of a host platform 221 for DIMM-to-DIMM communication is explained with reference to the system of FIG. 3B. The CPU 220 of the host platform 221 may identify data dependencies to offload a NMP command to the first NMP DIMM $300_1$ among the first NMP DIMM $300_1$ and the third NMP DIMM $300_3$. Subsequently, the CPU may initiate aggregation of data to the first NMP DIMM $300_1$ among the first NMP DIMM $300_1$ and the third NMP DIMM $300_3$ by queuing data read requests to the first NMP DIMM $300_1$. The first NMP DIMM $300_1$ may establish a communication with the third NMP DIMM $300_3$ through corresponding ports, i.e., through the first port $311_1$ of the first NMP DIMM $300_1$ and the first port $315_1$ of the third NMP DIMM $300_3$. The first NMP DIMM $300_1$ may receive the data from the third NMP DIMM $300_3$ through the corresponding ports. Thereafter, the first NMP DIMM $300_1$ may receive a NMP command from the CPU 220 of the host platform 221. On receiving the NMP command, the first NMP DIMM $300_1$ may process the NMP command using the received data from the third NMP DIMM $300_3$ and may send a NMP command completion notification to the CPU 220 of the host platform 221.

Similar operations may be accomplished between the first NMP DIMM $300_1$ and the second NMP DIMM $300_2$ using the second port $311_2$ of the first NMP DIMM $300_1$ and the second port $313_2$ of the second NMP DIMM $300_2$, and a similar operation may be accomplished between the third NMP DIMM $300_3$ and the fourth NMP DIMM $300_4$ using the second port $315_2$ of the third NMP DIMM $300_3$ and the second port $317_2$ of the fourth NMP DIMM $300_4$, as shown by the dark lines in FIG. 3B and thus a repeated description thereof is omitted for conciseness. In some embodiments, the first NMP DIMM $300_1$ may identify data dependencies on the first NMP DIMM $300_1$ and the third NMP DIMM $300_3$ and the fourth NMP DIMM $300_4$ based on the parsed NMP command. The first NMP DIMM $300_1$ may establish a communication with the third NMP DIMM $300_3$ through the first port $311_1$ of the first NMP DIMM $300_1$ and the first port $315_1$ of the third NMP DIMM $300_3$ and the third NMP DIMM $300_3$ may establish a communication with the fourth NMP DIMM $300_4$ through the second port $315_2$ of the third NMP DIMM $300_3$ and the second port $317_2$ of the fourth NMP DIMM $300_4$. The selection of the first port $311_1$ of the first NMP DIMM $300_1$ for communication with the first port $315_1$ of the third NMP DIMM $300_3$ may be performed through the SW $311_3$, which in turn may be based on identification of data dependencies on the third NMP DIMM $300_3$. The selection of the second port $315_2$ of the third NMP DIMM $300_3$ for communication with the second port $317_2$ of the fourth NMP DIMM $300_4$ may be performed through the SW $315_3$, based on identification of data dependencies on the fourth NMP DIMM $300_4$. The third NMP DIMM $300_3$ may receive the data from the fourth NMP DIMM $300_4$ through the corresponding ports and the first NMP DIMM $300_1$ may receive the data from the third NMP DIMM $300_3$ through the corresponding ports. On receiving the data, the first NMP DIMM $300_1$ may process the NMP command using the received data from the third NMP DIMM $300_3$ and the fourth NMP DIMM $300_4$ and may send a NMP command completion notification to the CPU 220 of the host platform 221.

Figure 4:
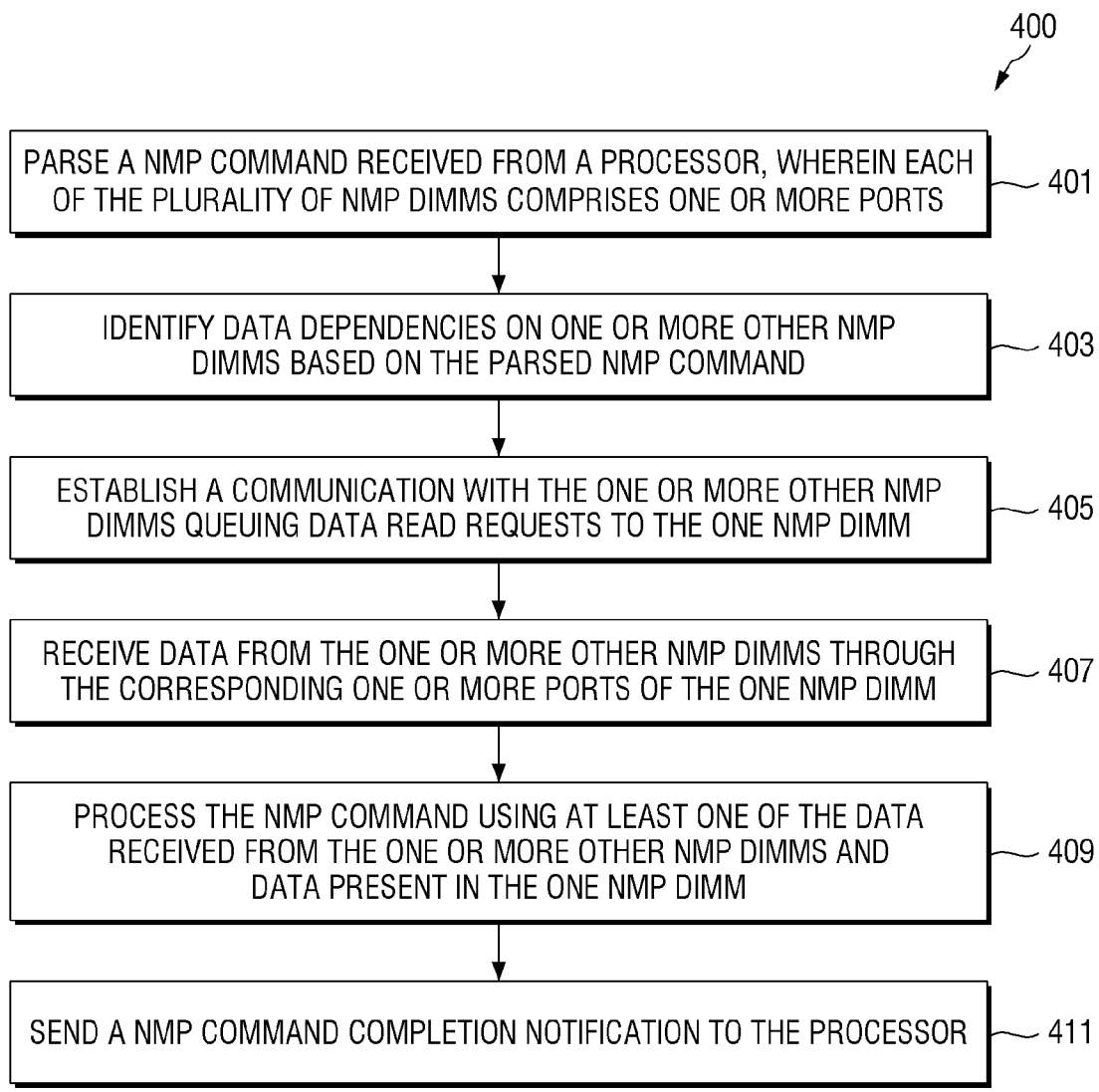
FIG. 4 illustrates a flowchart showing a method for operating a NMP DIMM for DIMM-to-DIMM communication, in accordance with some embodiments.

FIG. 4 illustrates a flowchart showing a method for operating a NMP DIMM for DIMM-to-DIMM communication in accordance with some embodiments.

As illustrated in FIG. 4, the method 400 includes one or more blocks for operating a NMP DIMM for DIMM-to-DIMM communication in accordance with some embodiments. The method 400 may be described in the general context of computer executable instructions. Generally, computer executable instructions may include routines, programs, objects, components, data structures, procedures, units, and functions, which perform particular functions or implement particular abstract data types. The computer executable instructions are executed by a microprocessor and/or CPU, which are described above, to cause the microprocessor and/or the CPU to perform the operations illustrated in the method.

The order in which the operations of the method 400 is described is not intended to be construed as a limitation, and any number of the described method blocks may be combined in any order to implement the method. Additionally, individual blocks may be deleted from the methods without departing from the scope of the subject matter described herein. Furthermore, the method may be implemented in any suitable hardware, software, firmware, or combination thereof.

At block 401, one NMP DIMM among a plurality of NMP DIMMs may parse a NMP command received from a processor of a host platform. Each of the plurality of NMP DIMMs may comprise one or more ports, as described in the above embodiments.

At block 403, the one NMP DIMM may identify data dependencies on one or more other NMP DIMMs based on the parsed NMP command.

At block 405, the one NMP DIMM may establish a communication with the one or more other NMP DIMMs through corresponding one or more ports of the one NMP DIMM. When the one NMP DIMM comprises one port, the one port may communicatively connect the one NMP DIMM and the first NMP DIMM of the one or more other NMP DIMMs through the one port of the one NMP DIMM, as illustrated by way of example in FIG. 2B. When the one NMP DIMM comprises two ports, a first port of the one NMP DIMM may communicatively connect the one NMP DIMM and the first NMP DIMM of the one or more other NMP DIMMs and a second port of the one NMP DIMM may communicatively connect the one NMP DIMM and a second NMP DIMM of the one or more other NMP DIMMs to form a network of the plurality of NMP DIMMs, as illustrated by way of example in FIG. 3B At block 407, the one NMP DIMM may receive the data from the one or more other NMP DIMMs through the corresponding one or more ports of the one NMP DIMM.

At block 409, the one NMP DIMM may process the NMP command using at least one of the data received from the one or more other NMP DIMMs and data present in the one NMP DIMM.

At block 411, the one NMP DIMM may send a NMP command completion notification to the processor of the host platform.

Figure 5:
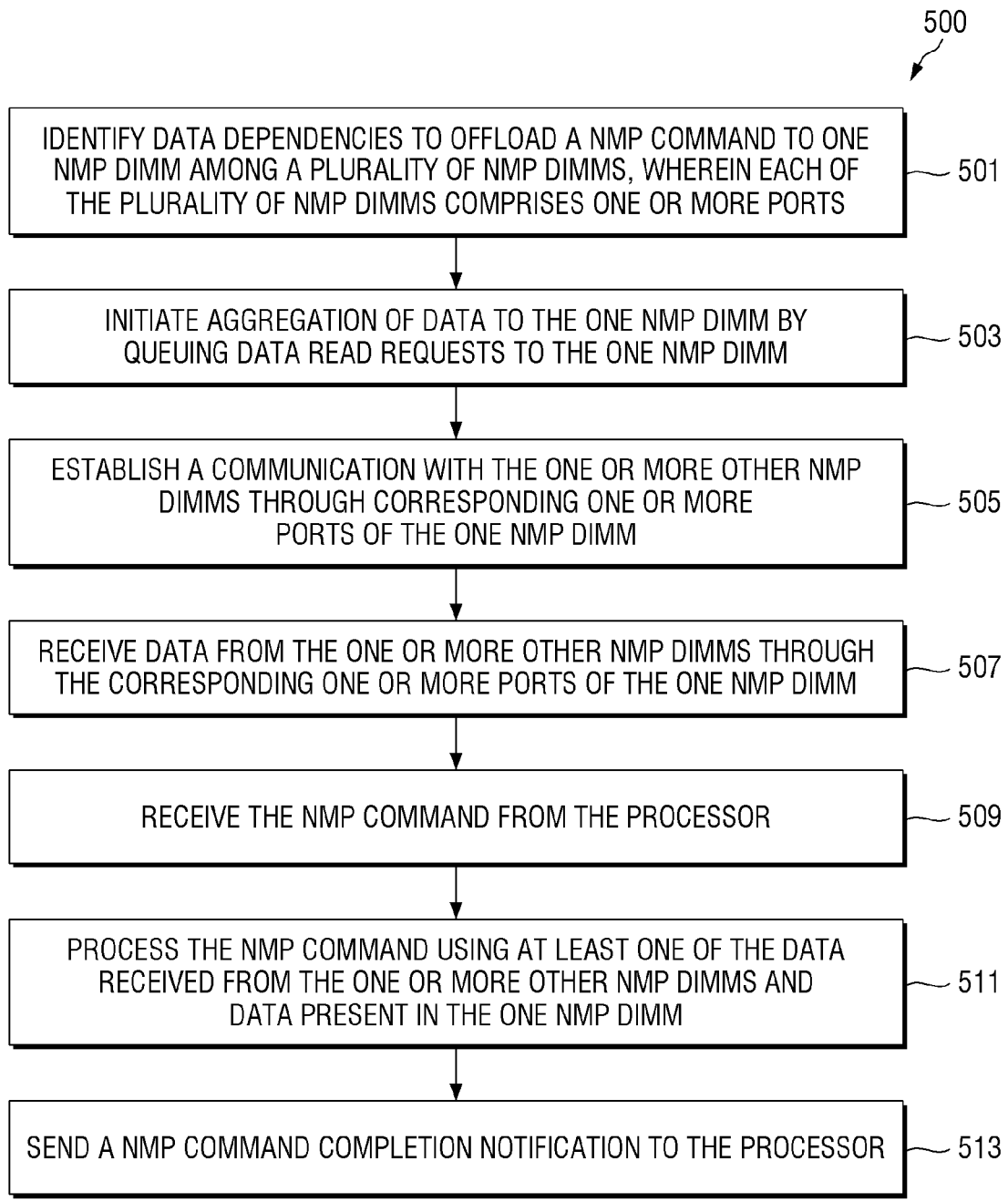
FIG. 5 illustrates a flowchart showing a method for operating a system for DIMM-to-DIMM communication, in accordance with some embodiments.

FIG. 5 illustrates a flowchart showing a method for operating a system for DIMM-to-DIMM communication in accordance with some embodiments.

As illustrated in FIG. 5, the method 500 includes one or more blocks for operating a NMP DIMM for DIMM-to-DIMM communication in accordance with some embodiments. The method 500 may be described in the general context of computer executable instructions. Generally, computer executable instructions may include routines, programs, objects, components, data structures, procedures, units, and functions, which perform particular functions or implement particular abstract data types. The computer executable instructions are executed by a microprocessor and/or CPU, which are described above, to cause the microprocessor and/or the CPU to perform the operations illustrated in the method.

The order in which the operations of the method 500 is described is not intended to be construed as a limitation, and any number of the described method blocks can be combined in any order to implement the method. Additionally, individual blocks may be deleted from the methods without departing from the scope of the subject matter described herein. Furthermore, the method may be implemented in any suitable hardware, software, firmware, or combination thereof.

At block 501, a processor of a host platform may identify data dependencies to offload a NMP command to one NMP DIMM among a plurality of NMP DIMMs. Each of the plurality of NMP DIMMs may comprise one or more ports.

At block 503, the processor of the host platform may initiate aggregation of data to the one NMP DIMM among a plurality of NMP DIMMs by queuing data read requests to the one NMP DIMM.

At block 505, the one NMP DIMM may establish communication with one or more other NMP DIMMs through corresponding one or more ports of the one NMP DIMM. When the one NMP DIMM comprises one port, the one port may communicatively connect the one NMP DIMM and the first NMP DIMM of the one or more other NMP DIMMs through the one port of the one NMP DIMM, as illustrated by way of example in FIG. 2B. When the one NMP DIMM comprises two ports, a first port of the one NMP DIMM may communicatively connect the one NMP DIMM and the first NMP DIMM of the one or more other NMP DIMMs and a second port of the one NMP DIMM may communicatively connect the one NMP DIMM and a second NMP DIMM of the one or more other NMP DIMMs to form a network of the plurality of NMP DIMMs, as illustrated by way of example in FIG. 3B.

At block 507, the one NMP DIMM may receive the data from the one or more other NMP DIMMs through the corresponding one or more ports of the one NMP DIMM. At block 509, the one NMP DIMM may receive a NMP command from the processor of the host platform.

At block 511, the one NMP DIMM may process the NMP command using at least one of the data received from the one or more other NMP DIMMs and data present in the one NMP DIMM.

At block 513, the one NMP DIMM may send a NMP command completion notification to the processor of the host platform.

Some advantages of various embodiments are given below:

The use of a NMP DIMM with single port (as shown in FIGS. 2A and 2B) or two ports (as shown in FIGS. 3A and 3B) allows easy and fast data sharing across a plurality of NMP DIMMs. This approach reduces CPU load in the host considerably and consequently, reduces latency to the data movement and reduces CPU processing cycles in the host.

The approach of connecting one of the one or more ports of each of the plurality of NMP DIMMs to at least one remote server through an external switch enables easy and fast data access from other networking nodes (servers).

Various embodiments improve system performance by offloading data preparation used as part of NMP operations on a NMP DIMM.

Various embodiments present low latency read/write accesses to other NMP DIMM by a processing node on a NMP DIMM.

The described operations may be implemented as a method, system or article of manufacture using standard programming and/or engineering techniques to produce software, firmware, hardware, or any combination thereof. The described operations may be implemented as code maintained in a "non-transitory computer readable medium", where a processor may read the code from the computer readable medium and execute the code to perform the operations of the method. The processor may be at least one of a microprocessor and a processor capable of processing and executing the queries. A non-transitory computer readable medium may include media such as magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), etc. Further, non-transitory computer-readable media include all computer-readable media except for a transitory medium. In some embodiments, the code implementing the described operations may further be implemented in hardware logic (e.g., an integrated circuit chip, Programmable Gate Array (PGA), Application Specific Integrated Circuit (ASIC), etc.).

The terms "an embodiment", "embodiment", "embodiments", "the embodiment", "the embodiments", "one or more embodiments", "some embodiments", "various embodiments" and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

A description of an embodiment with several components in communication with each other does not imply that all such components are required. On the contrary, a variety of optional components are described to illustrate the wide variety of possible embodiments.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

The illustrated operations of FIGS. 4 and 5 show certain events occurring in a certain order. In alternative embodiments, certain operations may be performed in a different order, modified or removed. Moreover, steps may be added to the above-described logic and still conform to the described embodiments. Further, operations described herein may occur sequentially or certain operations may be processed in parallel. Yet further, operations may be performed by a single processing unit or by distributed processing units.

Finally, the language used in the specification has been principally selected for readability and instructional purposes, and it may not have been selected to delineate or circumscribe the inventive subject matter. It is therefore intended that the scope of the various embodiments be limited not by this detailed description, but rather by the claims that issue on an application based here on. Accordingly, the disclosure of the embodiments is intended to be illustrative, but not limiting, of the scope thereof, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for operating a Near Memory Processing (NMP) Dual In-line Memory Module (DIMM) for DIMM-to-DIMM communication, the method comprising:

parsing, by one NMP DIMM among a plurality of NMP DIMMs, a NMP command received from a processor of a host platform, wherein each of the plurality of NMP DIMMs comprises one or more ports;

identifying, by the one NMP DIMM, data dependencies on one or more other NMP DIMMs among the plurality of NMP DIMMs, based on the parsed NMP command;

establishing, by the one NMP DIMM, direct communication between one or more ports of the one or more other NMP DIMMs and the one or more ports of the one NMP DIMM;

receiving, by the one NMP DIMM, data from the one or more other NMP DIMMs through the one or more ports of the one NMP DIMM;

processing, by the one NMP DIMM, the NMP command that is received from the processor of the host platform, using at least one of the data received from the one or more other NMP DIMMs and data present in the one NMP DIMM; and sending, by the one NMP DIMM, a NMP command completion notification to the processor of the host platform.

2. The method as claimed in claim 1, wherein the one NMP DIMM comprises one port, and
wherein the establishing the communication comprises:
communicatively connecting the one NMP DIMM and a first NMP DIMM of the one or more other NMP DIMMs by the one port of the one NMP DIMM.

3. The method as claimed in claim 1, wherein the one NMP DIMM comprises a first port and a second port, and
wherein the establishing the communication comprises:
communicatively connecting the one NMP DIMM and a first NMP DIMM of the one or more other NMP DIMMs by the first port; and
communicatively connecting the one NMP DIMM and a second NMP DIMM of the one or more other NMP DIMMs by the second port.

4. The method as claimed in claim 3, wherein the one NMP DIMM comprises a switch, and
wherein the method further comprises:
selecting, by the switch of the one NMP DIMM, one of the first port and the second port.

5. The method as claimed in claim 1, wherein one of the one or more ports of each of the plurality of NMP DIMMs is communicatively connected to at least one remote server through an external switch for accessing data.

6. A Near Memory Processing (NMP) Dual In-line Memory Module (DIMM) for DIMM-to-DIMM communication, the NMP DIMM comprising:
one or more ports, each of the one or more ports configured to establish communication with a port of another NMP DIMM among a plurality of NMP DIMMs; and
a processing node communicatively interfaced with each of the one or more ports, the processing node configured to:
parse a NMP command received from a processor of a host platform,
identify data dependencies on one or more other NMP DIMMs among the plurality of NMP DIMMs, based on the parsed NMP command,
receive data directly from the one or more other NMP DIMMs through the one or more ports and the port of the another NMP DIMM,
process the NMP command that is received from the processor of the host platform, using at least one of the data received from the one or more other NMP DIMMs and data present in the NMP DIMM, and
send a NMP command completion notification to the processor of the host platform.

7. The NMP DIMM as claimed in claim 6, wherein the NMP DIMM comprises one port, and
wherein the processing node is configured to:
communicatively connect the NMP DIMM and a first NMP DIMM of the one or more other NMP DIMMs through the one port.

8. The NMP DIMM as claimed in claim 6, wherein the NMP DIMM comprises a first port and a second port, and
wherein the processing node is configured to:
communicatively connect the NMP DIMM and a first NMP DIMM of the one or more other NMP DIMMs through the first port; and
communicatively connect the NMP DIMM and a second NMP DIMM of the one or more other NMP DIMMs through the second port.

9. The NMP DIMM as claimed in claim 8, wherein the NMP DIMM comprises a switch, and
wherein the processing node is configured to:
select one of the first port and the second port using the switch.

10. The NMP DIMM as claimed in claim 6, wherein one of the one or more ports is communicatively connected to at least one remote server through an external switch for accessing data.

11. A method for operating Near Memory Processing (NMP) Dual In-line Memory Module (DIMM) for DIMM-to-DIMM communication, the method comprising:
identifying, by a processor of a host platform, data dependencies to offload a NMP command to one NMP DIMM among a plurality of NMP DIMMs, wherein each of the plurality of NMP DIMMs comprises one or more ports;
initiating, by the processor of the host platform, aggregation of data at the one NMP DIMM by queuing data read requests targeted to one or more other NMP DIMMs, at the one NMP DIMM;
establishing, by the one NMP DIMM, direct communication with the one or more ports of the one or more other NMP DIMMs among the plurality of NMP DIMMs through the one or more ports of the one NMP DIMM;
receiving, by the one NMP DIMM based on the queued data read requests, data from the one or more other NMP DIMMs through the one or more ports of the one NMP DIMM;
receiving, by the one NMP DIMM, the NMP command from the processor of the host platform;
processing, by the one NMP DIMM, the NMP command that is received from the processor of the host platform, using at least one of the data received from the one or more other NMP DIMMs and data present in the one NMP DIMM; and
sending, by the one NMP DIMM, a NMP command completion notification to the processor of the host platform.

12. The method as claimed in claim 11, wherein the one NMP DIMM comprises one port, and
wherein the establishing the communication comprises:
communicatively connecting the one NMP DIMM and a first NMP DIMM of the one or more other NMP DIMMs by the one port of the one NMP DIMM.

13. The method as claimed in claim 11, wherein the one NMP DIMM comprises a first port and a second port, and
wherein the establishing the communication comprises:
communicatively connecting the one NMP DIMM and a first NMP DIMM of the one or more other NMP DIMMs by the first port; and
communicatively connecting the one NMP DIMM and a second NMP DIMM of the one or more other NMP DIMMs by the second port.

14. The method as claimed in claim 13, wherein the one NMP DIMM comprises a switch, and
the method further comprises:
selecting, by the switch of the one NMP DIMM, one of the first port and the second port.

15. The method as claimed in claim 11, wherein one of the one or more ports of each of the plurality of NMP DIMMs is communicatively connected to at least one remote server through an external switch for accessing data.

* * * * *